(12) United States Patent
Sim-Tang et al.

(10) Patent No.: US 9,122,627 B1
(45) Date of Patent: *Sep. 1, 2015

(54) METHOD FOR LOCK-FREE CLUSTERED ERASURE CODING AND RECOVERY OF DATA ACROSS A PLURALITY OF DATA STORES IN A NETWORK

(75) Inventors: Siew Yong Sim-Tang, Saratoga, CA (US); Semen Alexandrovich Ustimenko, Novosibirsk (RU)

(73) Assignee: Dell Software Inc., Aliso Viejo, CA (US)

( * ) Notice: Subject to any disclaimer, the term of this patent is extended or adjusted under 35 U.S.C. 154(b) by 618 days.

This patent is subject to a terminal disclaimer.

(21) Appl. No.: 13/492,330

(22) Filed: Jun. 8, 2012

Related U.S. Application Data

(60) Division of application No. 13/241,004, filed on Sep. 22, 2011, now Pat. No. 8,205,139, which is a continuation of application No. 12/695,407, filed on Jan. 28, 2010, now Pat. No. 8,051,361, which is a continuation of application No. 11/198,062, filed on Aug. 5, 2005, now Pat. No. 7,681,105.

(60) Provisional application No. 60/599,963, filed on Aug. 9, 2004.

(51) Int. Cl.
*G11C 29/00* (2006.01)
*H03M 13/00* (2006.01)
*G06F 11/10* (2006.01)

(52) U.S. Cl.
CPC .......... *G06F 11/1076* (2013.01); *G06F 11/108* (2013.01); *G06F 11/1088* (2013.01); *G06F 11/1092* (2013.01)

(58) Field of Classification Search
CPC .............. G06F 11/1076; G06F 11/108; G06F 11/1088; G06F 11/1092
USPC .................................. 714/770, 767, 769, 780
See application file for complete search history.

(56) References Cited

U.S. PATENT DOCUMENTS

| | | | | |
|---|---|---|---|---|
| 4,336,612 A | * | 6/1982 | Inoue et al. | 714/755 |
| 4,371,754 A | * | 2/1983 | De et al. | 714/10 |
| 4,402,045 A | * | 8/1983 | Krol | 712/29 |
| 4,512,020 A | * | 4/1985 | Krol et al. | 714/781 |
| 4,593,351 A | * | 6/1986 | Hong et al. | 712/21 |
| 4,633,472 A | * | 12/1986 | Krol | 714/11 |
| 4,710,926 A | * | 12/1987 | Brown et al. | 714/4.4 |
| 4,868,742 A | * | 9/1989 | Gant et al. | 710/30 |
| 4,884,194 A | * | 11/1989 | Krol et al. | 714/11 |
| 4,897,841 A | * | 1/1990 | Gang, Jr. | 370/401 |
| 4,975,834 A | * | 12/1990 | Xu et al. | 712/28 |
| 5,020,060 A | | 5/1991 | Murai et al. | |

(Continued)

OTHER PUBLICATIONS

Sep. 7, 2012 Listing of Related Applications of Assignee.

*Primary Examiner* — Joseph D Torres
(74) *Attorney, Agent, or Firm* — Winstead PC

(57) ABSTRACT

The present invention provides a distributed clustering method to allow multiple active instances of consistency management processes that apply the same encoding scheme to be cooperative and function collectively. The techniques described herein facilitate an efficient method to apply an erasure encoding and decoding scheme across dispersed data stores that receive constant updates. The technique can be applied on many forms of distributed persistent data stores to provide failure resiliency and to maintain data consistency and correctness.

5 Claims, 15 Drawing Sheets

(56) References Cited

U.S. PATENT DOCUMENTS

| | | | | |
|---|---|---|---|---|
| 5,032,985 A * | 7/1991 | Curran et al. | 711/124 |
| 5,051,887 A * | 9/1991 | Berger et al. | 711/162 |
| 5,155,820 A * | 10/1992 | Gibson | 712/210 |
| 5,235,687 A * | 8/1993 | Bacot et al. | 711/165 |
| 5,253,359 A * | 10/1993 | Spix et al. | 714/46 |
| 5,255,367 A * | 10/1993 | Bruckert et al. | 714/11 |
| 5,276,684 A * | 1/1994 | Pearson | 370/438 |
| 5,295,258 A * | 3/1994 | Jewett et al. | 714/12 |
| 5,305,326 A * | 4/1994 | Solomon et al. | 714/6.12 |
| 5,375,128 A * | 12/1994 | Menon et al. | 714/770 |
| 5,379,305 A | 1/1995 | Weng | |
| 5,388,013 A | 2/1995 | Nakamura | |
| 5,437,022 A * | 7/1995 | Beardsley et al. | 714/6.1 |
| 5,560,033 A * | 9/1996 | Doherty et al. | 713/340 |
| 5,574,849 A * | 11/1996 | Sonnier et al. | 714/12 |
| 5,574,939 A * | 11/1996 | Keckler et al. | 712/24 |
| 5,579,475 A * | 11/1996 | Blaum et al. | 714/6.32 |
| 5,581,777 A * | 12/1996 | Kim et al. | 712/16 |
| 5,588,112 A * | 12/1996 | Dearth et al. | 714/5.11 |
| 5,594,918 A * | 1/1997 | Knowles et al. | 712/15 |
| 5,606,569 A | 2/1997 | MacDonald et al. | |
| 5,651,129 A * | 7/1997 | Yokote et al. | 711/104 |
| 5,682,512 A * | 10/1997 | Tetrick | 711/202 |
| 5,734,859 A * | 3/1998 | Yorimitsu et al. | 711/112 |
| 5,768,623 A * | 6/1998 | Judd et al. | 710/37 |
| 5,819,020 A | 10/1998 | Beeler, Jr. | |
| 5,835,940 A * | 11/1998 | Yorimitsu et al. | 711/112 |
| 5,862,403 A * | 1/1999 | Kanai et al. | 710/6 |
| 5,875,475 A * | 2/1999 | Kizu et al. | 711/154 |
| 5,942,005 A | 8/1999 | Hassner et al. | |
| 5,974,563 A * | 10/1999 | Beeler, Jr. | 714/5.11 |
| 6,041,431 A | 3/2000 | Goldstein | |
| 6,055,646 A * | 4/2000 | Uchihori et al. | 714/6.12 |
| 6,138,125 A * | 10/2000 | DeMoss | 707/999.202 |
| 6,157,967 A * | 12/2000 | Horst et al. | 710/19 |
| 6,223,301 B1 * | 4/2001 | Santeler et al. | 714/6.2 |
| 6,226,687 B1 * | 5/2001 | Harriman et al. | 709/246 |
| 6,289,376 B1 * | 9/2001 | Taylor et al. | 709/219 |
| 6,295,575 B1 * | 9/2001 | Blumenau et al. | 711/5 |
| 6,374,329 B1 * | 4/2002 | McKinney et al. | 711/141 |
| 6,389,573 B1 | 5/2002 | Weng | |
| 6,397,365 B1 * | 5/2002 | Brewer et al. | 714/766 |
| 6,405,289 B1 * | 6/2002 | Arimilli et al. | 711/145 |
| 6,421,711 B1 * | 7/2002 | Blumenau et al. | 709/213 |
| 6,430,702 B1 * | 8/2002 | Santeler et al. | 714/6.22 |
| 6,430,723 B2 * | 8/2002 | Kodama et al. | 714/770 |
| 6,553,408 B1 * | 4/2003 | Merrell et al. | 709/213 |
| 6,584,438 B1 * | 6/2003 | Manjunath et al. | 704/228 |
| 6,606,727 B1 | 8/2003 | Yang et al. | |
| 6,633,960 B1 * | 10/2003 | Kessler et al. | 711/144 |
| 6,654,830 B1 * | 11/2003 | Taylor et al. | 710/74 |
| 6,654,831 B1 * | 11/2003 | Otterness et al. | 710/74 |
| 6,674,720 B1 * | 1/2004 | Passint et al. | 370/235 |
| 6,711,344 B1 * | 3/2004 | Ito et al. | 386/344 |
| 6,748,488 B2 * | 6/2004 | Byrd et al. | 711/114 |
| 6,751,721 B1 * | 6/2004 | Webb et al. | 712/10 |
| 6,769,088 B1 | 7/2004 | Weng | |
| 6,799,255 B1 * | 9/2004 | Blumenau et al. | 711/152 |
| 6,823,409 B2 * | 11/2004 | Jones et al. | 710/107 |
| 6,839,808 B2 * | 1/2005 | Gruner et al. | 711/130 |
| 6,886,162 B1 * | 4/2005 | McKenney | 718/102 |
| 6,889,245 B2 * | 5/2005 | Taylor et al. | 709/203 |
| 6,892,282 B2 * | 5/2005 | Hass et al. | 711/146 |
| 6,895,477 B2 * | 5/2005 | Hass et al. | 711/146 |
| 6,901,482 B2 * | 5/2005 | Gruner et al. | 711/130 |
| 6,954,825 B2 * | 10/2005 | Nagasoe et al. | 711/114 |
| 6,988,130 B2 * | 1/2006 | Blumenau et al. | 709/213 |
| 7,013,379 B1 * | 3/2006 | Testardi | 711/206 |
| 7,062,541 B1 * | 6/2006 | Cannon et al. | 709/219 |
| 7,076,510 B2 * | 7/2006 | Brown | 1/1 |
| 7,076,597 B2 * | 7/2006 | Webb et al. | 711/141 |
| 7,103,636 B2 * | 9/2006 | Glasco | 709/206 |
| 7,103,824 B2 | 9/2006 | Halford | |
| 7,124,143 B2 * | 10/2006 | Matsunami et al. | 1/1 |
| 7,124,258 B2 * | 10/2006 | Nakayama et al. | 711/154 |
| 7,149,846 B2 * | 12/2006 | Hetrick | 711/114 |
| 7,225,208 B2 * | 5/2007 | Midgley et al. | 1/1 |
| 7,228,469 B2 * | 6/2007 | Ito | 714/718 |
| 7,246,212 B2 * | 7/2007 | Yagisawa et al. | 711/162 |
| 7,266,716 B2 * | 9/2007 | Frolund et al. | 714/6.1 |
| 7,308,605 B2 * | 12/2007 | Jardine et al. | 714/11 |
| 7,327,287 B2 | 2/2008 | Martinian et al. | |
| 7,334,029 B2 * | 2/2008 | Shiga et al. | 709/223 |
| 7,334,089 B2 * | 2/2008 | Glasco | 711/143 |
| 7,346,744 B1 * | 3/2008 | Glasco | 711/141 |
| 7,376,862 B2 * | 5/2008 | Hajji et al. | 714/6.1 |
| 7,409,581 B2 * | 8/2008 | Santeler et al. | 714/6.1 |
| 7,421,553 B2 * | 9/2008 | Nakayama et al. | 711/162 |
| 7,437,472 B2 * | 10/2008 | Rose | 709/231 |
| 7,441,144 B2 * | 10/2008 | Hyytiainen | 714/6.2 |
| 7,535,913 B2 * | 5/2009 | Minami et al. | 370/401 |
| 7,680,995 B1 * | 3/2010 | Chang | 711/162 |
| 7,681,104 B1 * | 3/2010 | Sim-Tang et al. | 714/763 |
| 7,681,105 B1 * | 3/2010 | Sim-Tang et al. | 714/763 |
| 7,698,428 B2 * | 4/2010 | Fatula, Jr. | 709/226 |
| 7,703,102 B1 * | 4/2010 | Eppstein et al. | 718/104 |
| 8,051,361 B2 | 11/2011 | Sim-Tang et al. | |
| 2002/0070796 A1 * | 6/2002 | Gay-Bellile et al. | 329/304 |
| 2002/0161848 A1 * | 10/2002 | Willman et al. | 709/213 |
| 2003/0033572 A1 * | 2/2003 | Walton et al. | 714/763 |
| 2003/0097518 A1 * | 5/2003 | Kohn et al. | 711/5 |
| 2010/0162044 A1 | 6/2010 | Sim-Tang et al. | |

\* cited by examiner

METHOD FOR LOCK-FREE CLUSTERED ERASURE CODING AND RECOVERY OF DATA ACROSS A PLURALITY OF DATA STORES IN A NETWORK

CROSS-REFERENCE TO RELATED APPLICATIONS

This application is related to and/or claims priority to the applications set forth in the Application Data Sheet. Each of the applications set forth in the Application Data Sheet is hereby incorporated by reference in its entirety into this application.

BACKGROUND OF THE INVENTION

1. Field of the Invention

The present invention relates to a novel consistency management method that applies redundancy encoding and decoding of data blocks across a plurality of interconnected data stores in a network.

2. Description of the Related Art

Erasure coding is an error correction encoding and decoding scheme. Erasure coding is applied to a set of data stores to generate one or more redundant data blocks to protect against erasure of the actual data. A data store refers to a persistent memory for a given data block. In the event of data loss, part of the remaining original data blocks and part of the redundant data blocks can be used to recover the entire original data set. In the event of a device failure (e.g., a data store failure), and when a replacement device is available, the recovered data blocks can be used to reconstruct a latest consistent state of the failed device for distribution to the replacement device.

There are many different types of erasure or error correction coding known in the art. These include, without limitation, data mirroring, parity coding, and algebraic-based coding. Data mirroring and parity coding generally create one additional data block from a number N of original data blocks. This type of coding scheme allows a single data set to survive through one failure while still having the capability to reconstruct the original data. Multi-dimensional parity coding may be applied across several data sets to allow for two or more concurrent failures. Such multiple dimensional parity coding supports multiple failures by combining multiple encoded data sets. Thus, for example, in the case of the two-dimensional parity coding, vertical and horizontal data sets individually allow only one failure, whereas the combination of both data sets allows for two failures. Algebraic-based coding schemes, such as a Reed Solomon code, take N data blocks and generate N+M data blocks. This well-known process is illustrated in FIG. 1, using the N data blocks 101, and an encoding algorithm 103, which generates a (N+M) data set 110 having M checksum blocks 105. The associated recovery procedure also is well-known as to illustrated by example in FIG. 2. In this example, blocks D2, D4 and C3 are presumed to be bad; nevertheless, the decoding algorithm 202 can still be used to recover D2 and D4, which blocks are then used to recover the checksum block C3.

In general, when a data failure occurs, this type of algebraic-encoding scheme requires only any random N copies of data blocks from the N+M number of data blocks to reconstruct the lost data. Thus, algebraic encoding supports up to M concurrent failures in a single data set. To apply algebraic-based coding, when an encoding process detects a data change from one data store, it must generate and update all M redundant data blocks. In other words, it is required that the process have the capability to ensure all M redundant data blocks are completely updated. Because the process may fail during the update (during which other failures may also occur simultaneously), there needs to be a self-healing technique to recover the data from the failure(s).

When applying multiple redundancy erasure coding (such as algebraic-based coding) to data blocks in a set of data stores, one also needs to consider the consistency of the entire data set as well as the correctness of the data blocks. A set of data blocks is considered to be consistent if all the redundant blocks are generated from all the original data blocks. For example, in FIG. 1 all the redundant data blocks 105 are generated by all the data blocks 101 using the encoding algorithm 103. In the event of an update failure during encoding, the set of data blocks may become inconsistent, as indicated in FIG. 3 and as described in more detail below. The common solutions to address an inconsistent set of data blocks are: do nothing, manage the situation on a case-by-case basis using a specific application, or simply re-execute the encoding process to regenerate all the redundant data blocks in a data store, as illustrated in FIG. 4. The problem with the first solution is that the set of data blocks becomes inconsistent and incorrect. If failure occurs to the inconsistent data set (as shown in FIG. 3), the decoding process would generate incorrect data. The second solution may result in implementation complexity. The main issue with the third solution is that it does not address data correctness. In particular, when a procedure that modifies a data block fails in the middle of the operation, the data within the block is inconsistent and incorrect, as illustrated in FIG. 5. The third solution also does not address the situation where there are data store failures. When a data store failure occurs, and if the data store is used for storing the actual data, the re-encoding process cannot proceed. If the data store is used for storing a redundant block, then the re-encoding process is not able to update all the redundant data stores, in which case there is no way to identify which data block is inconsistent when the unavailable data store becomes available again.

While multiple redundancy erasure coding could increase data reliability, it has not been possible to apply it to persistent data stores that are being constantly updated. To address this deficiency, there needs to be an efficient and simple consistency management method in an encoding process to apply the erasure coding. Such a consistency management method would allow data stores to self-heal from failures, and it would ensure data consistency and correctness among all the data blocks.

The present invention addresses this need in the art.

SUMMARY OF THE INVENTION

The invention provides an efficient method to apply an erasure encoding and decoding scheme across multiple dispersed data stores that receive constant updates. A data store is a persistent memory for storing a data block. Such data stores include, without limitation, a group of disks, a group of disk arrays, a distributed storage area network (SAN) with virtual data blocks or virtual volumes, or any other standalone or distributed systems, machines, or devices, that hold content fragments over LAN and WAN. The data blocks may contain, by way of example, raw block data, database records, fragments of files, or any fragments of application information. As will be seen, the invention allows for self-healing of each individual data store, and it maintains data consistency and correctness within a data block and among a group of data blocks. The inventive technique can be applied on many forms of distributed persistent data stores to provide failure resiliency and to maintain data consistency and correctness.

The present invention provides a distributed clustering method to allow multiple active instances of consistency management processes that apply the same encoding scheme to be cooperative and function collectively. The techniques described herein facilitate an efficient method to apply an erasure encoding and decoding scheme across dispersed data stores that receive constant updates. The technique can be applied on many forms of distributed persistent data stores to provide failure resiliency and to maintain data consistency and correctness.

The invention provides a lock free technique to enable a plurality of active process instances functioning as a cluster to perform erasure encoding and decoding on a data set residing in a set of distributed and persistent data stores.

A more specific embodiment of the invention provides improves reliability by having a plurality of such processes functioning as a cluster to apply erasure coding to facilitate multiple redundancy on disk blocks residing in the data stores in an array of disks.

Another more general aspect of the invention is a lock free clustering method to allow a plurality of encoding processes to function as a cluster to apply erasure coding using a data sequencing method.

Another aspect of the invention is a reconstruction process that recovers lost data from data store failure and places the recovered data into replacement data stores.

According to embodiments, the invention facilitates a simple and efficient method for providing failure resiliency in distributed and persistent data stores, for maintaining the consistency and correctness of the data in the data stores, and for ensuring the recoverability of the data upon multiple concurrent failures.

The foregoing has outlined some of the more pertinent features of the invention. These features should be construed to be merely illustrative. Many other beneficial results can be attained by applying the disclosed invention in a different manner or by modifying the invention as will be described.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention. In the accompanying drawings:

FIG. 11 shows a block wrapper for storing sequence numbers and update completion flags;

DETAILED DESCRIPTION OF THE PREFERRED EMBODIMENT

As described above, the present invention relates generally to a method and system for maintaining data correctness and consistency while applying erasure coding to a distributed set of data stores. A highly-efficient sequencing technique is used to perform erasure encoding and decoding for multiple concurrent data stores, while maintaining data consistency and integrity even during processing and device failures. In general, the purpose of this invention is to provide failure resiliency of the data stores by allowing automated self healing and maintaining data consistency and correctness.

The invention is described with reference to specific architectures and protocols. Those skilled in the art, however, will recognize that the description is for illustration purposes only. One embodiment provides a method to apply multiple redundancy erasure coding to a disk array, and to enable that array to self-recover to a consistent state under multiple concurrent failures. Another embodiment provides a method to apply multiple redundancy erasure coding in two dimensions to a group of disk arrays. These embodiments, however, are not limiting, as the principles may be applied in any standalone or distributed processing or data storage environment.

The representative embodiments are described in more detail below.

A. Multiple Redundancy Coding

As noted above, one form of multiple redundancy coding is an algebraic-based code, such as Reed Solomon, Rabin's Information Dispersal Algorithm (IDA), or the like.

This type of code interprets symbols larger than bits as elements, and uses the elements to calculate parity or checksum symbols. The specific algebraic-based code that may be useful here is beyond the scope of this invention. It is merely assumed that one such code is used for the implementation.

Figure 1:
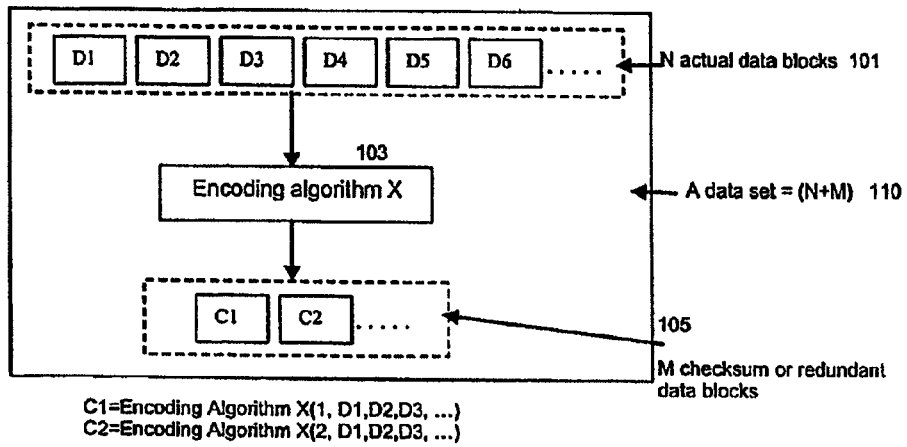
FIG. 1 is an illustration of a known erasure encoding procedure.
Figure 2:
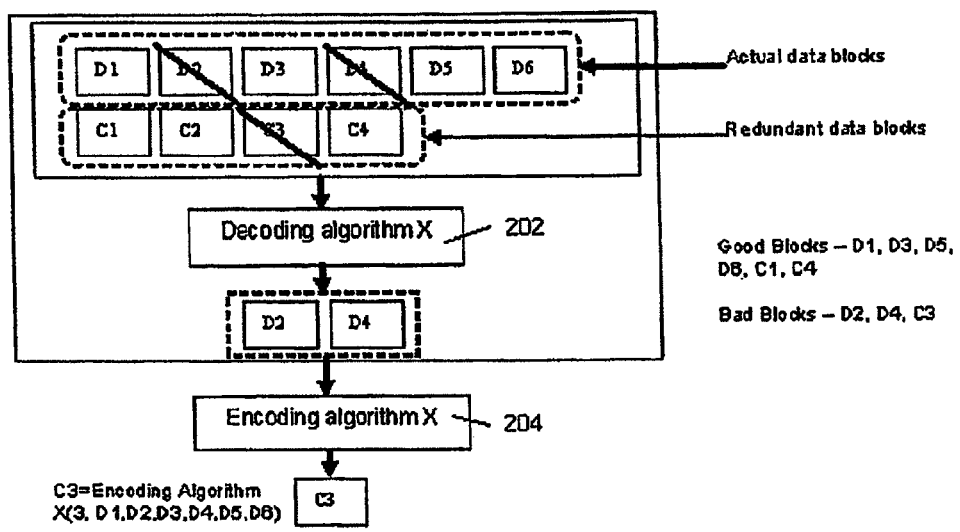
FIG. 2 is an illustration of a known recovery procedure using a combination of decoding and encoding.

As illustrated in FIG. 1, and as well-known in the prior art, a multiple redundancy code applies its encoding algorithm 103 to N data elements to generate N+M data elements. The N+M data elements are a data set 110. In the data set, M elements 105 are the checksum elements. A multiple redundancy code requires any N elements from the data set of N+M elements to facilitate decoding as shown, by way of example, in FIG. 2. In this example, as noted above, it is assumed that data blocks D2 and D4, as well as checksum block C3, have been lost. Nevertheless, the decoding algorithm 202 is used to re-generate the data blocks D2 and D4, which are then used by encoding algorithm 204 to re-generate the checksum block C3. Thus, more generally, if some data elements are not available, this known scheme applies decoding and then re-encoding as needed to generate the complete data set.

Figure 6:
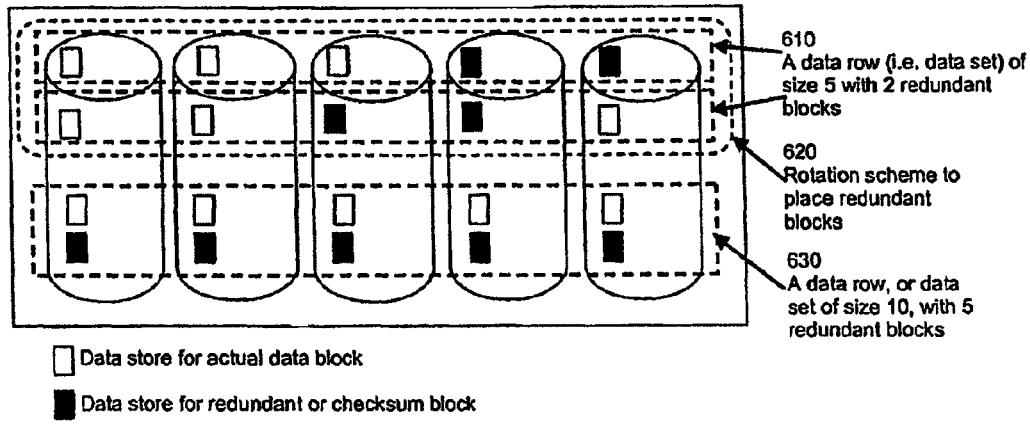
FIG. 6 provides an illustrative embodiment of a data set configuration on a disk array.
Figure 7:
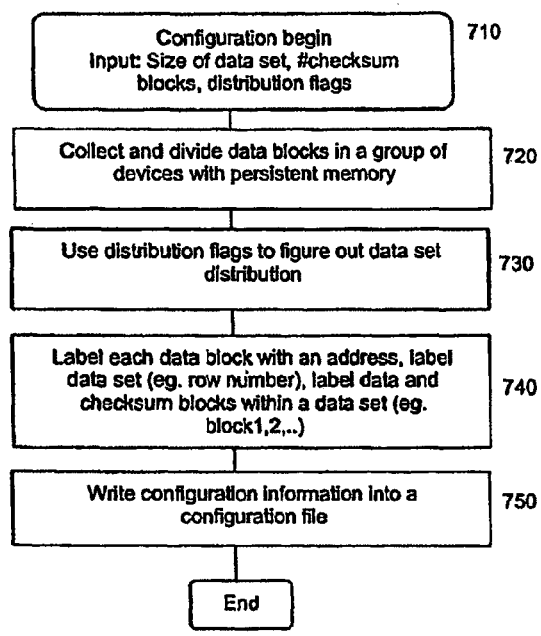
FIG. 7 is a process flow diagram showing a data set configuration process in a disk array.

This type of algebraic-based code is very powerful if used on persistent data stores (such as disks or distributed devices) with persistent memory for constant read and write operations. To apply this type of code on persistent data stores that update constantly, however, one must have a technique that can manage random processor or device failures during the encoding and decoding process. Such a technique must have the capability of recovering from a failure during encoding, it must maintain data correctness and data store consistency, and it must provide automated self-healing of the data stores. It must also work appropriately with the encoding and decoding scheme to ensure failure resiliency to the persistent data stores. The present invention solves these and other problems associated with the known art, as will now be described B. Multiple Redundancy Coding on a Disk Array B.1 Disk Array Configuration FIG. 6 illustrates a disk array 600 of five disks. A configuration process is used to configure the disk array. This process is typically implemented as software, namely, a set of instructions that are executable in one or more processors. The configuration process is illustrated in FIG. 7. In particular, and as will be described in more detail below, the configuration process beginning at step 710, takes given input parameters and divides the disks into groups of data set stores (for storing erasure encoded data); the configuration process also labels all the data stores with a type and an address. The data store type indicates if the store is to be used for storing an actual data block or checksum block. A data store may span multiple disk sectors. The input parameters preferably include a size of data set, a number of checksum blocks in each set, and a distribution flag to indicate a method for deciding the distribution of the data sets and the location of the checksum blocks within a data set.

An administrator or other user may configure the size of a data set to be the same as the number of disks in an array. Preferably, and depending on the coding scheme involved, the number of checksum blocks is smaller then the size of the data set. The higher the number of checksum blocks, the more concurrent failures the disk array can sustain; therefore, the higher the reliability of the array. A simple method of data set and checksum block distribution is illustrated in FIG. 6 by reference numeral 610. This method simply lines up one data store block per disk to form a data row. In the illustrated example, the number of checksum block is two, so one may use the last two disks for storing checksum blocks. In another example, as shown by reference numeral 620 in to FIG. 6, a rotating scheme is used to put checksum blocks at different locations for different data sets. It may also be desirable to create data set size larger then the number of the disks. For example, in the rotating scheme 620, the size of the data set is two times the number of disks, with the first data row for storing actual data, and the second row for storing checksum data. In still another embodiment, as illustrated by reference numeral 630, a data set of size 10 includes five (5) data stores and five (5) redundant blocks.

As noted above, FIG. 7 is a flowchart illustrating a representative data set configuration process. The process begins at step 710 with the input parameters previously described. At step 720, the process collects and divides the data blocks across a group of devices each having persistent memory. At step 730, the process utilizes the distribution flags to determine a data set distribution. At step 740, the process labels each data block, and labels the data and checksum blocks within a data set. The routine then writes the configuration information into a configuration file at step 750 to complete the processing.

Once the configuration is done, any convenient erasure coding scheme (e.g., a Reed Solomon scheme) can be applied as data is inserted into the stores. In particular, when data is input to a data store, an encoding process is triggered. During encoding, an erasure encoding process of the present invention uses the configuration information generated by process illustrated in FIG. 7 to locate the data sets. The configuration information includes the layout of the data sets in one or multiple data stores or devices. In particular, the layout describes an erasure group by rows or columns, the distribution of the blocks in the group, as well as the description of which block is actual data and which block is a checksum (i.e. a recovery block). The configuration information may specify the block address range for each group such that, when a block is to be modified, its address is used to locate the group. The configuration information also may be a given function that can identify a data set when a block address is input to the function. For example, assume the storage is a five disk array of a specific size (e.g., 10 GB) with the distribution of the erasure coding being as illustrated by reference numeral 610. When block X of disk 1 is to be modified, the erasure group of X in disk 1 would then be {X in disk 1, X in disk 2, X in disk 3, X in disk 4, and X in disk 5}.

B.2 Data Set Consistency

By way of background, a data set is said to be "consistent" if all the checksum blocks are encoded using all the actual data blocks. Suppose for example:

W is a set containing all the actual data blocks, where there are N elements; [0060] V is a set containing all the checksum blocks, where there are M elements The data set then is U=W+V A "consistent" data set is then defined as follows:

$v_i$=erasure encode (i, $w_1, w_2, \ldots w_N$) where I=1 . . . M; where $v_i$ belongs to V, and $w_1$ to $w_N$ belongs to W.

B.3 Data Set Partition

A data set is "partitioned" if some subsets of the checksum blocks are encoded with some subsets of the actual data blocks. A combination of the consistent checksum and actual data block subsets then forms a data set "partition" as follows:

W=a set of actual data blocks, V=a set of checksum data blocks $E_i$=a subset of W, where i=integer 1 . . . u $F_i$=a subset of V, where j=integer 1 . . . u $E_1 + \ldots + E_u = W$ $F_1 + \ldots + F_u = V$ $E_1, \ldots E_0$ may overlap, and each one of them may be empty $F_1, \ldots F_0$ may overlap, and each one of them may be empty All elements of $E_i$ are encoded with all elements of $F_i$.

A data set partition $i = E_i + F_i$, where $u = 1 \ldots u$

Figure 3:
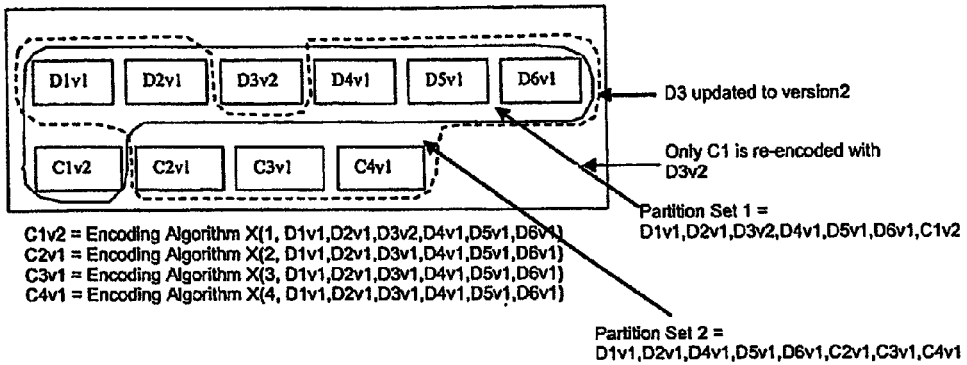
FIG. 3 is an illustration of an inconsistent data set.
Figure 4:
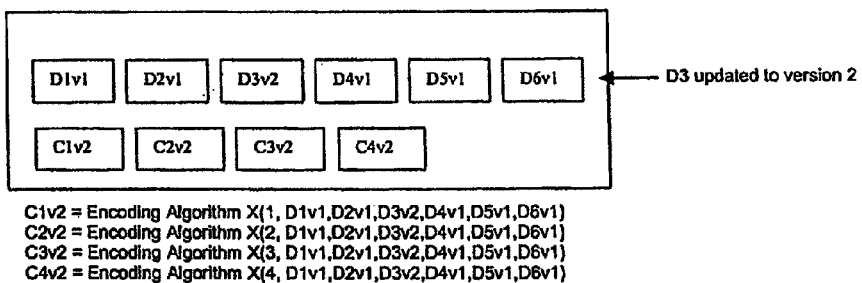
FIG. 4 is an illustration of a roll-forward operation to restore consistency.
Figure 5:
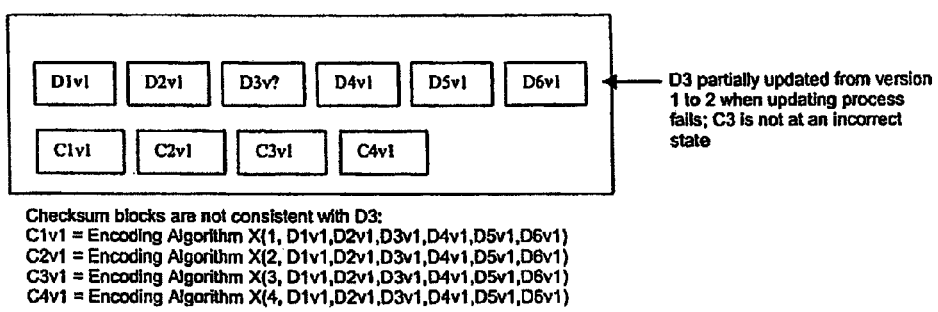
FIG. 5 is an illustration of an incorrect and inconsistent data set.

FIG. 3 shows two such partitions:

Data set partition $1 = D1v1, D2v1, D4v1, D5v1, D6v1, R2v1, R3v1, R4v1$

Data set partition $2 = D1v1, D2v1, D3v2, D4v1, D5v1, D6v1, R1v2$

When a data set is partitioned, each one of the partitions is consistent, but the data set as a whole is said to be inconsistent. An inconsistent data set is illustrated in FIG. 3.

B.4 Data Correctness

A "correct" data block is a data block that is completely updated during a write operation. Thus, for example, assume a data block is at state 1 initially when an update (to modify the data block to state 2) occurs. If the update only modifies a portion of the block (e.g., the data block contains some state 1 information and some state 2 information), the data block is said to be incorrect.

B.5 Erasure Encoding Using Sequencing

Assume C is a counter for a data set, N is the number of actual data blocks in a data set, and M is the number of the checksum blocks in a data set. Further, assume there is one registry for each data store for the actual data or checksum blocks and in which a sequence number is recorded.

Figure 8:
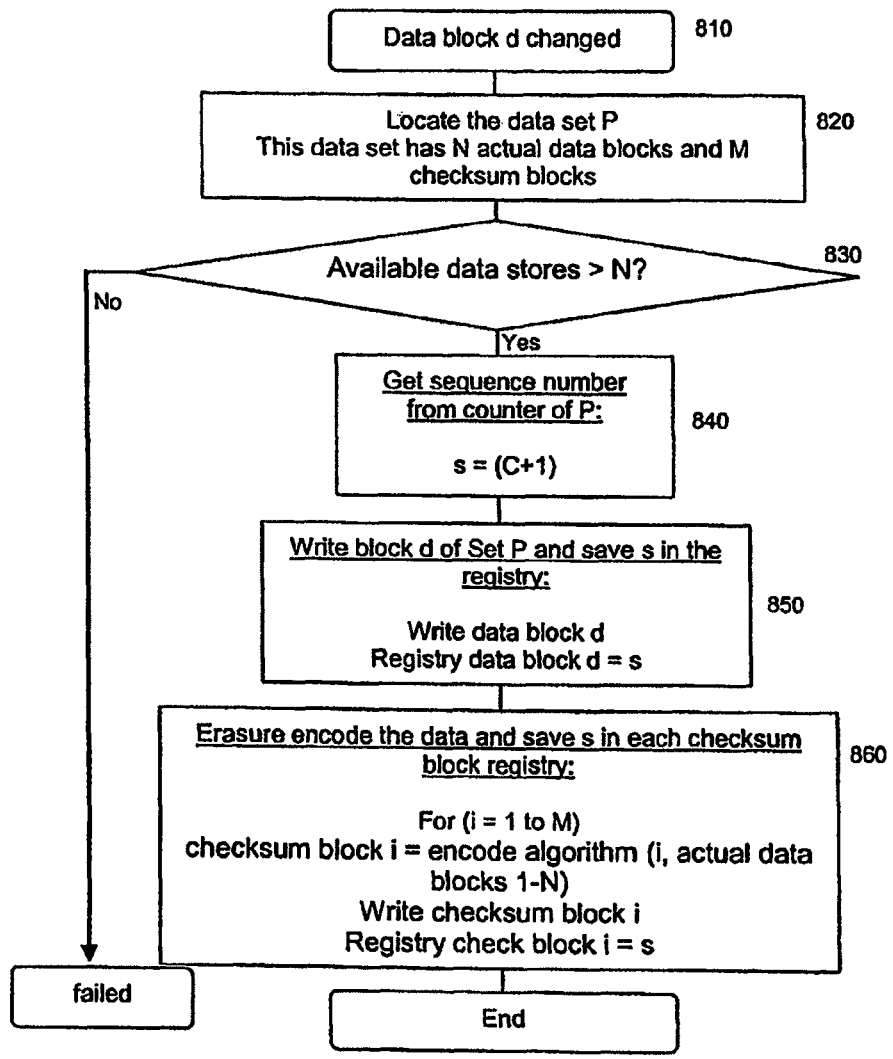
FIG. 8 is a process flow diagram showing an erasure encoding process that may be used to encode a data set using a sequencing method.

When an actual data block d is changed and an update to its data store is needed, the erasure encoding process in FIG. 8 is executed. This process may be implemented in code executable on one or more processors. First, the encoding process locates the data set and the actual location (data stores) of each of the data and checksum blocks. This is step 820. A test is then performed at step 830 to determine if the number of data stores available is greater than N. If not, the routine fails and terminates. If, however, the outcome of the test at step 830 is positive, the encoding process then increments the counter of the data set to generate a new sequence numbers. This is step 840. The new sequence number s is then used to enter the registry of the updating data block d and all the checksum blocks once they are modified (steps 850 and 860). In particular, at step 850, the process writes the data block d and saves the new sequence number s in the data block's associated registry. At step 860, the process then erasure encodes the data and saves the new sequence number in each checksum block registry, as checksum blocks are always modified by changes to any underlying data block. The encoding process of FIG. 8 is now illustrated using several examples.

EXAMPLES

Assume a given data set has five (5) data blocks and two (2) check blocks. In the illustrative embodiment, this requires a total of seven (7) registries. As used herein, a "registry" is any accessible portion of memory or data storage. One or more registries generally comprise a data structure (or data array, linked list, or the like), with a given position in the data structure corresponding to a given registry. At time $t_0$, assume the counter C of the data set is initialized to a given value (e.g., zero (0)) and the registries are initialized to the given value as follows.

Time $t_0$:
Counter C=0

| D1 | D2 | D3 | D4 | D5 | C1 | C2 |
|---|---|---|---|---|---|---|
| 0 | 0 | 0 | 0 | 0 | 0 | 0 |

At time $t_1$, data block number two (2) changes. After executing the encoding process 800 as described above, the registries are now as follows:

Time $t_1$: D2 Changed
Counter C=1

| D1 | D2 | D3 | D4 | D5 | C1 | C2 |
|---|---|---|---|---|---|---|
| 0 | 1 | 0 | 0 | 0 | 1 | 1 |

After that, assume there are the following sequences of changes:

Time $t_2$: D3 Changed
Counter C=2

| D1 | D2 | D3 | D4 | D5 | C1 | C2 |
|---|---|---|---|---|---|---|
| 0 | 1 | 2 | 0 | 0 | 2 | 2 |

Time $t_3$: D5 Changed
Counter C=3

| D1 | D2 | D3 | D4 | D5 | C1 | C2 |
|---|---|---|---|---|---|---|
| 0 | 1 | 2 | 0 | 3 | 3 | 3 |

Time $t_4$: D3 Changed
Counter C=4

| D1 | D2 | D3 | D4 | D5 | C1 | C2 |
|---|---|---|---|---|---|---|
| 0 | 1 | 4 | 0 | 3 | 4 | 4 |

Failure Case 1:

At time $t_5$, assume that data block D4 changed, C1 is updated, but that C2 fails to be updated due to some device failure. The registry values are then as follows:

Time $t_5$: D4 Changed
Counter C=5

| D1 | D2 | D3 | D4 | D5 | C1 | C2 |
|---|---|---|---|---|---|---|
| 0 | 1 | 4 | 5 | 3 | 5 | 4 |

In such case, there are now two data set partitions:

Data set partition $1 = (D1, D2, D3, D4, D5, C1)$ state of $t_5$

Data set partition $2 = (D1, D2, D3, D5, C2)$ state of $t_4$

In this data set configuration, five (5) blocks (any of the actual data and checksum blocks) are required to reconstruct the entire seven (7) element data set. To bring the entire seven element set to a consistent state, either partition 1 or partition 2 can be used.

Assume that C2 becomes accessible later and no data is corrupted. The method either can roll forward the entire data set to state of $t_5$ by using partition one (1), or it can roll backward the data set to the state $t_4$ by using partition two (2).

Failure Case 2:

At time $t_5$, assume D4 changed, C1 is updated, but that C2 fails to be updated due to the C2 device failure and the device is to be replaced. The registry values are then as follows:

Time t5: D4 Changed
Counter C=5

| D1 | D2 | D3 | D4 | D5 | C1 | C2 |
|----|----|----|----|----|----|----|
| 0  | 1  | 4  | 5  | 3  | 5  | *  |

In this case, there are now two consistent data set partitions:
Data set partition 1=(D1, D2, D3, D4, D5, C1) state of t5
Data set partition 2=(D1, D2, D3, D5) state of t4

Because in this example a minimum of five (5) elements is required to recover the entire data set (due to the encoding scheme used), partition 2 is unacceptable. Thus, the only recovery choice is to roll forward to $t_5$ using partition one (1). The checksum block C2 in this case cannot be recovered, e.g., until a replacement device is ready. During this time, the data set can continue to be modified and updated as long as there is a consistency management method to identify the consistency and recover the data at any time in the future.

Failure Case 3:

At time $t_5$, assume D4 changed, and both C1 and C2 devices fail and replaced. The registry values are now as follows:

Time t5: D4 Changed
Counter C=5

| D1 | D2 | D3 | D4 | D5 | C1 | C2 |
|----|----|----|----|----|----|----|
| 0  | 1  | 4  | 5  | 3  | *  | *  |

In this case, there is only one consistent data set partition:
Set 1=(D1, D2, D3, D4, D5) state of t5

When replacement data stores are inserted, C1 and C2 can be reconstructed to state of $t_5$.

Although in the above examples the encoding method uses an increment of one (1) for the sequence number, this is not a requirement or a limitation of the technique. For example, the counter can be increment by a given amount, e.g., −1, 2, or any number. Moreover, the sequence number itself can be a given function of the counter.

Generalizing, as can be seen, the above-identified sequencing scheme involves several basic steps: (a) initializing a counter; (b) storing sequence numbers in a data structure (such as the registry table illustrated above) having N+M positions corresponding to the data blocks and their associated recovery blocks; (c) as a given data block is changed, (i) incrementing the counter by a given value (e.g., 1) (ii) assigning the value of the counter to the sequence number at a position associated with the given data block, and (iii) assigning the value of the counter to the sequence number at each position in the data structure associated with a recovery block; and (d) repeating step (c) as one or more data blocks are changed. The resulting data structure is then useful to facilitate a recovery process upon the occurrence of a failure event.

B.6 Correctness Determination

The above described encoding method does not have an indicator to determine if a data block is modified completely. To determine if a data block is correct, an indicator, such as a flag or another sequence number register for each data block, can be used. One embodiment is to have the sequence number entered in the header and trailer of the data and checksum block. FIG. 11, described below, shows a typical block structure. When either a data block or a checksum block changes, preferably the sequence number in both the block header and trailer is checked. If a block is partially written, then the header would not match the trailer. When a data block is partially modified after a failure, the data block is considered as an incorrect block and needs to be recovered. An illustrative recovery process is now described.

B.7 Recovery Process Using Sequence Number

When a device fails or when a software or hardware error occurs, some data blocks may be corrupted. When a failure occurs during the encoding process, the target data set may become corrupted and partitioned (i.e., inconsistent). Thus, according to the present invention, a recovery process is used to recover the data set to a consistent state. The recovery process typically is configured either to roll the data set forward to a most recent state, or to roll the data set backward to the state prior to the failure.

Figure 9A:
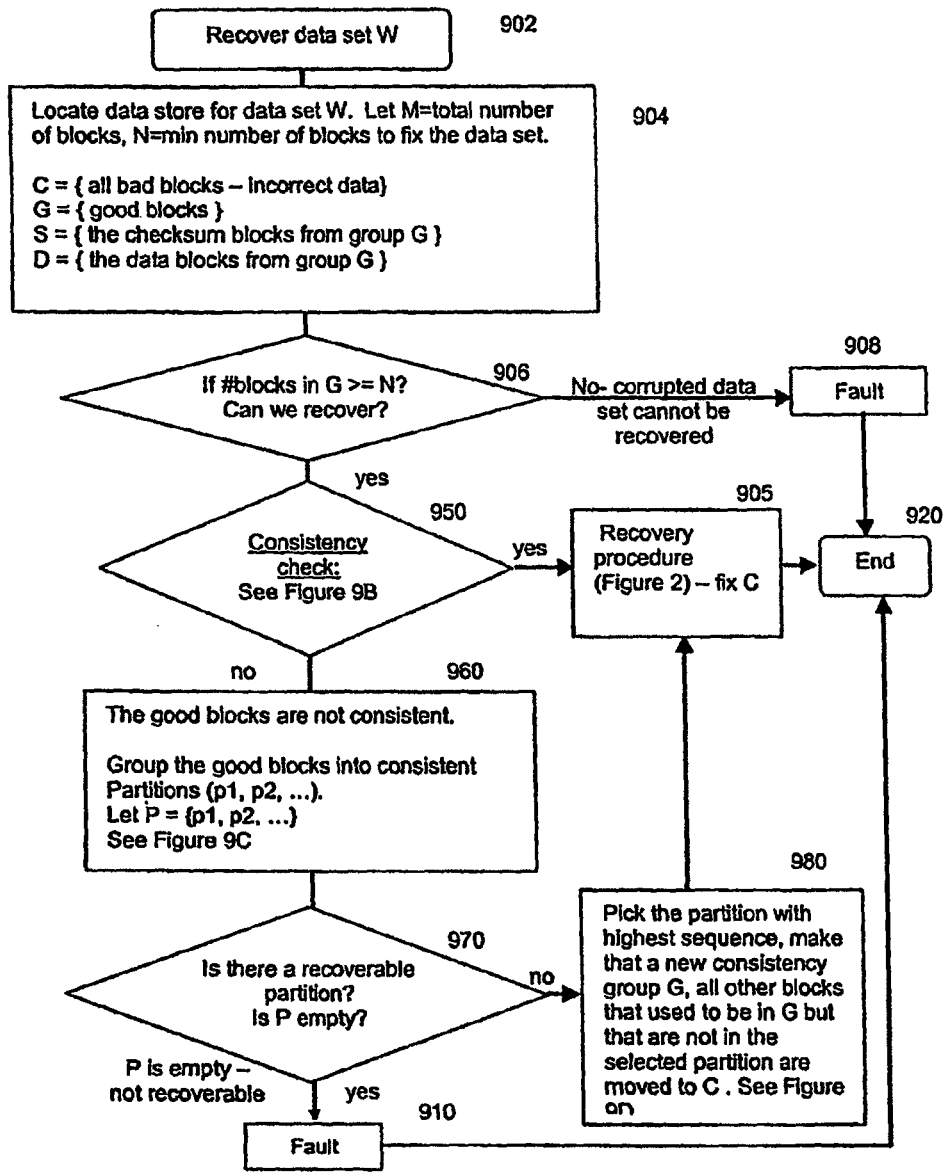
FIG. 9A is a process flow diagram showing an overall recovery process that may be used to recover a data set using sequence numbers.

FIG. 9A illustrates a representative recovery process that may be used to recover a corrupted data set to a consistent state. This process may be implemented in code executable on one or more processors. The routine begins at step 904 by first locating the data store for data set W. At this step, the recovery process groups the data blocks into bad blocks (C), uncorrupted good blocks (G), good checksum blocks (S), and good data blocks (D). Groups S and D are subset of G. Bad blocks are blocks that have inconsistent (e.g., different) header and trailer sequence numbers, or blocks from bad devices. Then, at step 906, the recovery process checks if there are enough good blocks to recover the entire data set. In this example, it is assumed that the data set has M number of blocks and the encoding algorithm requires N number of blocks to reconstruct the data set, where M>N. If not, the routine branches to step 908 to provide a fault indication. The routine then terminates at step 920.

Figure 9B:
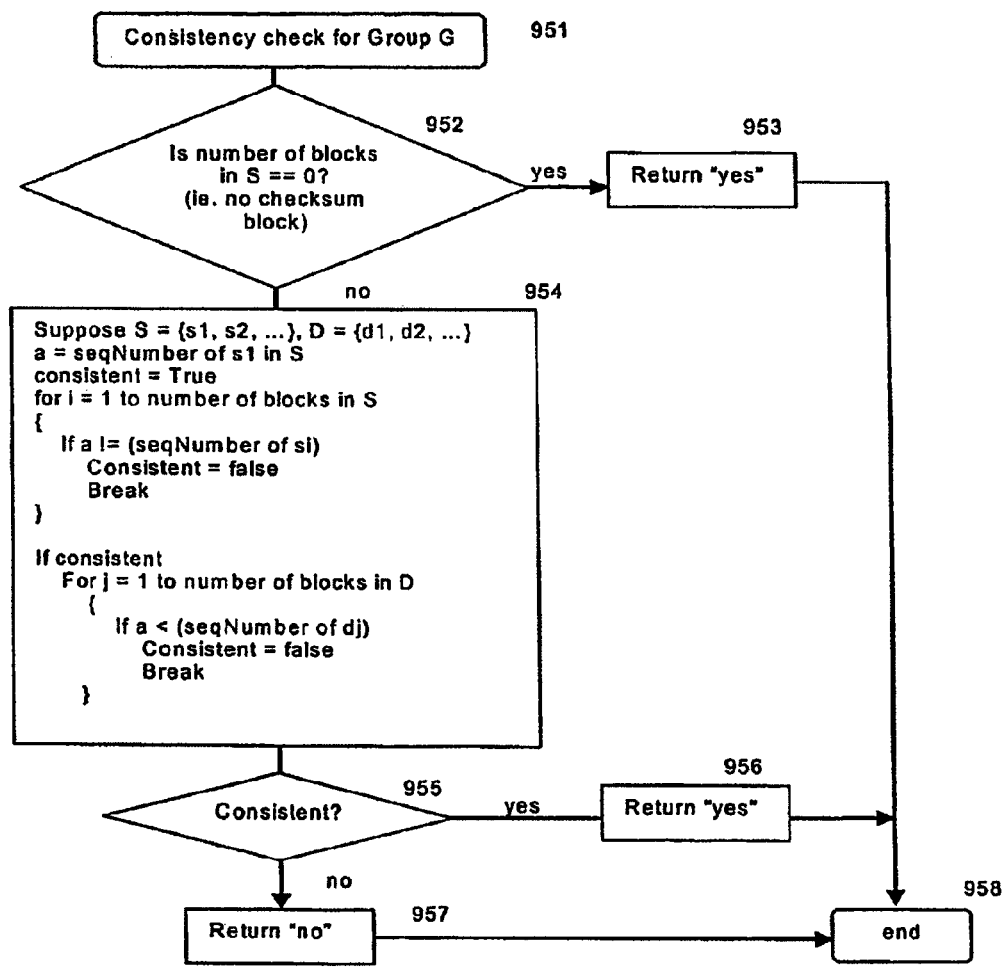
FIG. 9B is a process flow diagram of a consistency check step of the recovery process illustrated in FIG. 9A.

If there are enough good blocks to recover the data set, the routine continues at step 950 to perform a consistency check. This step is illustrated in FIG. 9B, and it is used to determine if the good blocks G are partitioned. As described above, a partition may occur when a failure takes place while the data set is going through encoding. A consistent group of blocks U is one where the sequence number of all the checksum blocks in the group is identical, and the sequence number of all the data blocks in U is less than or equal to the sequence number of the checksum blocks. If there is no checksum block in the group, then the group is said to be consistent (step 953); otherwise, the sequence number of all the blocks needs to be checked. This sequence number processing is illustrated in step 954 of FIG. 9B, which step is reached if the outcome of the test at step 952 is negative. Step 952 tests to determine whether the number S of good checksum blocks is equal to zero. After the processing in step 954, a test is performed at step 955 to determine whether, as a result of the processing, Group G is consistent. If so, a "yes" is returned at step 956; if not, a "no" is returned at step 957. The routine in FIG. 9B then returns at step 958.

Referring now back to FIG. 9A, if (as a result of the processing in FIG. 9B) the good blocks are consistent (i.e., if the good blocks are not partitioned), then a recovery procedure can be applied (on the good blocks) to re-construct the bad blocks. This is illustrated as step 907; one such recovery procedure is that illustrated in FIG. 2.

Figure 9C:
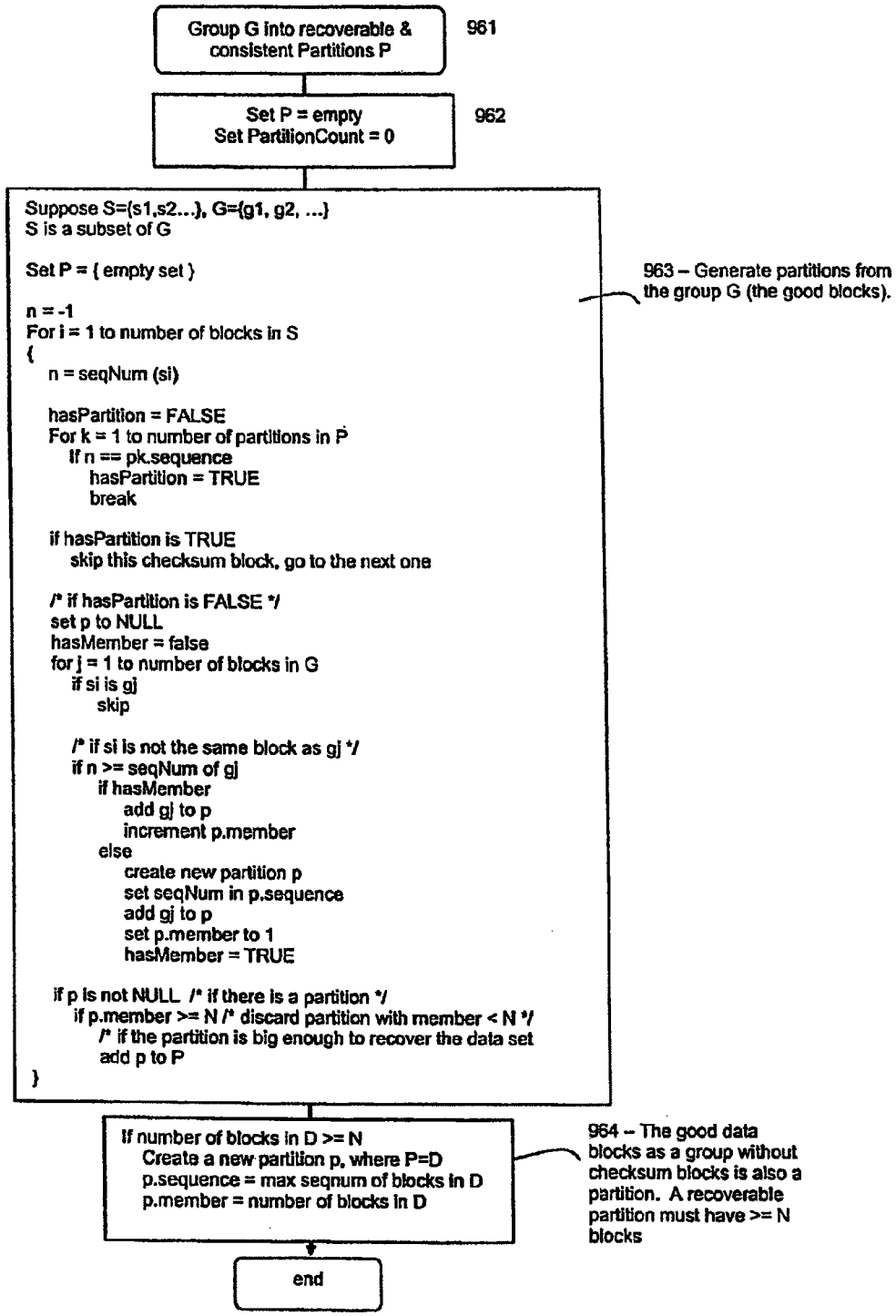
FIG. 9C is a process flow diagram of a partition generating step of the recovery process illustrated in FIG. 9A.

If (as a result of the processing in FIG. 9B) the good blocks are not consistent, then the recovery process continues in step 960. This step is required to locate all the consistent partitions. As noted above, a consistent partition is a consistent sub-group of the good blocks (G), as was illustrated (for example) in FIG. 3. The details of step 960 are shown in the process flow diagram of FIG. 9C. The routine begins at step 961 by grouping G into recoverable and consistent partitions P. At step 962, the routine sets P to an "empty" value and sets a PartitionCount equal to zero. Thereafter, the process in step 963 iterates the good checksum blocks and good data blocks according to the algorithm illustrated to create recoverable partitions, and it puts all the recoverable partitions into the set P. Each partition is a consistent sub-group, where the number of the checksum blocks are equal, and the sequence number of the data blocks is less than or equal to the checksum blocks. A recoverable partition preferably has at least N members; it is a consistent sub-group of the good blocks with at least N number of blocks and that is sufficient to recover the data set. At step 964, the routine then checks if the data blocks without the checksum block (D) are enough to form a recoverable partition. If so, this step creates a new partition that includes these blocks. This completes the processing Processing then returns to the main loop in FIG. 9A. In particular, a test is then performed at step 970 to determine whether there is a recoverable partition (i.e., is P empty?). If there is no recoverable partition located, then the data set is unrecoverable, as indicated by a positive outcome of the test at step 970; otherwise, at step 980, the routine picks a partition and continues to attempt to recover the data set with the processing shown in FIG. 9D. In particular, step 980 picks the partition with a highest sequence number and makes that a new consistency group G; all other blocks that used to be in G but that are not in the selected partition are moved to C.

Figure 9D:
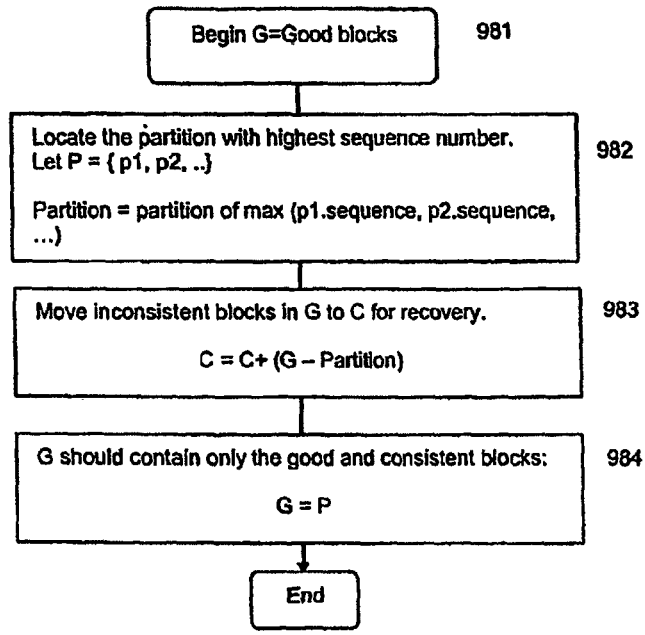
FIG. 9D is a process flow diagram of a partition locating step of the recovery process illustrated in FIG. 9A.

The routine shown in FIG. 9D illustrates one process to recover the data set, namely, by rolling the data forward to the most recent state. This technique is not meant to be taken as limiting, as has been previously noted. In this example, the routine begins at step 982 by locating the partition with the highest sequence number. All the blocks in G that are not in the selected partition are treated as bad blocks and are moved to group C for recovery. This is step 983. The only "good" blocks are now the blocks in the selected partition, as indicated by step 984. The data set is then forwarded to the applicable recovery process, such as the process shown in FIG. 2. As noted above, the recovery procedure in FIG. 2 uses decoding (and, if necessary, re-encoding) to reconstruct the entire data set.

To recover to an older state (roll backward), a partition of a lower sequence number can be selected in step 982, with the rest of the recovery process being as otherwise described.

B.8 Reconstruction Process Using Sequence Number

Figure 10:
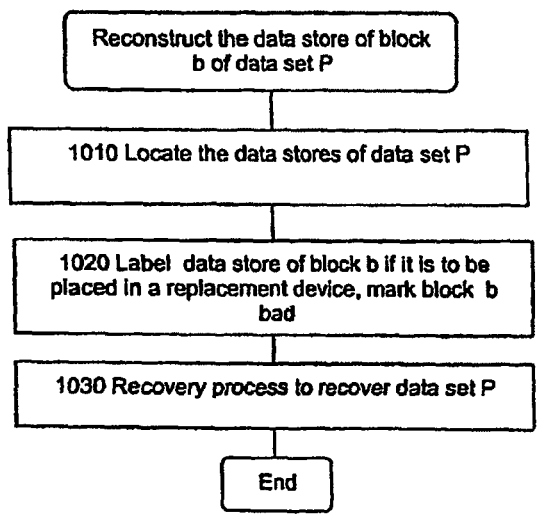
FIG. 10 is a process flow diagram showing a reconstruction process using sequence numbers.

When a data store is bad, the data block it holds is lost. When a new data store is inserted as a replacement, the data block in the bad data store needs to be reconstructed into the replacement data store. FIG. 10 illustrates a reconstruction process of the present invention that uses a recovery process to reconstruct data block b for a data store. This process may be implemented in code executable on one or more processors. The process preferably first locates the data set to which block b belongs. This is step 1010. At step 1020, the process then labels the data store of block b if it is to be placed in a new device. At this time, the process then marks the data store for block b as a bad block. At step 1030, the reconstruction process calls the recovery process to fix the data store of block b.

B.9 The Sequence Number Registry and Update Completion Flag

A method to apply the sequencing technique for erasure coding to disks is to create disk blocks (as data stores) to include a header and a trailer. The header and trailer are then used to wrap around the actual data or checksum block. This data structure 1100 is indicated in FIG. 11. Both the header 1102 and the trailer 1104 are used to store the sequence number of the i.sup.th data or checksum block 1106. By doing so, an incorrect block can be determined. In particular, if a block were partially modified, the header and trailer would not match. Using a block wrapper, an external counter (as indicated in step 830) is not required; rather, the next sequence number for encoding is simply an increment of the highest header number of the checksum blocks. In an alternate embodiment, of course, an external counting technique to increment the sequence number may be used in connection with the present invention.

C. Multiple Redundancy Coding on Disk Arrays

Figure 12:
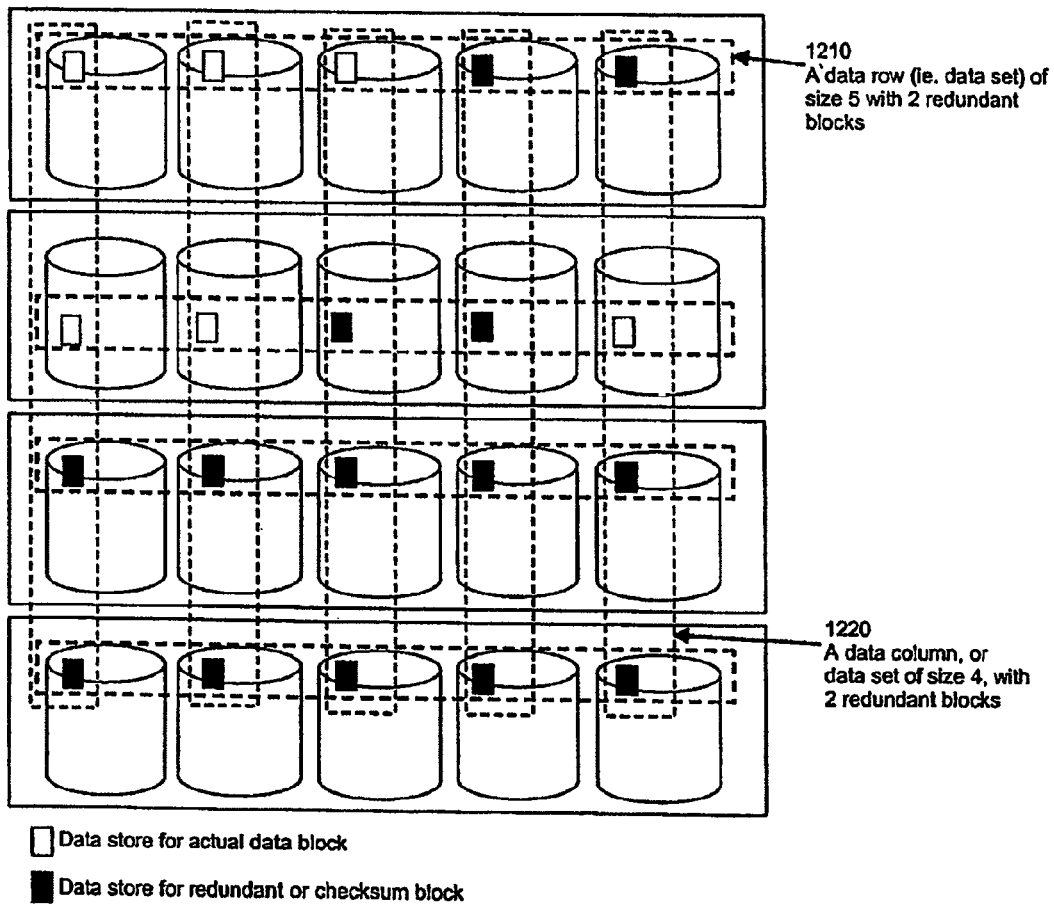
FIG. 12 is an illustrative embodiment of a data set configuration across multiple disk arrays in accordance with an alternate embodiment.

FIG. 12 shows that the above-described sequencing technique can be applied across disk arrays such that a given data set (in this case, a data row 1210 or a data column 1220) spans multiple disk arrays. This sequencing technique can also be used to apply two-dimensional multiple redundancy coding, e.g., using a combination of data rows and data columns. In a representative example, each row and each column is individually encoded. If the number of redundant or checksum blocks in a data row is K, and the number of redundant or checksum blocks in a data column is L, the total number of random and concurrent failures the disk arrays can support is (K+L). Thus, in FIG. 12, which is merely representative, the disk arrays are capable of surviving through four (4) random and concurrent failures.

The above-described technique provides numerous advantages. In particular, when erasure coding is applied to distributed and persistent data stores that support multiple concurrent failures, consistency management according to the present invention ensures recoverability. This is especially important when the data stores are scattered among many different devices over local or wide area networks. The sequencing technique automatically maintains and ensures data set consistency and correctness. The method enables self-recovery of a set of data blocks to a consistent and correct state after encountering one or more failures. A by-product of the technique is a set of failure-resilient, self-managed data stores.

D. Clustered Multiple Redundancy Coding

D.1 Redundant Coding Cluster Configuration

Figure 13:
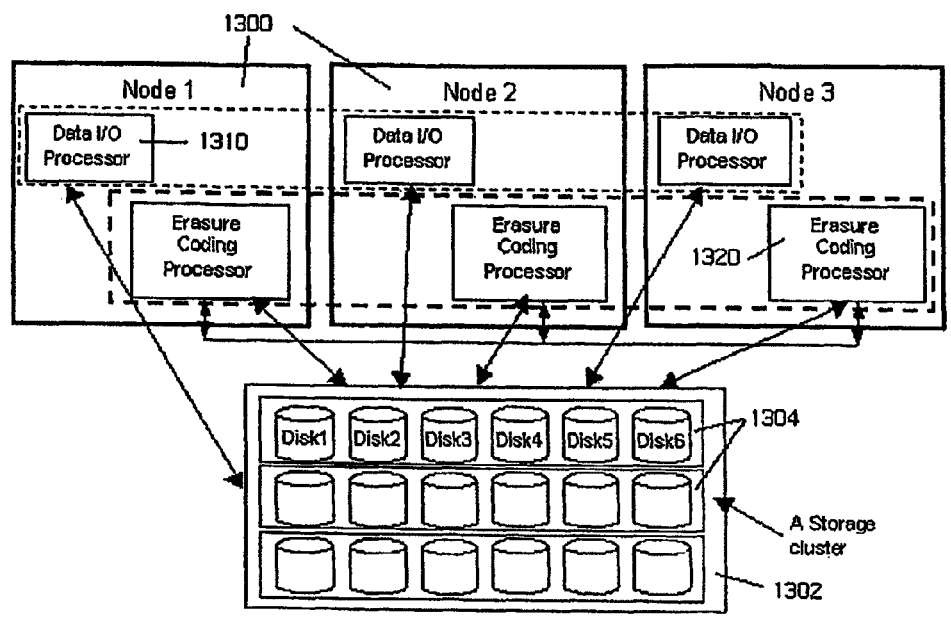
FIG. 13 provides an illustrative embodiment of an erasure coding processor cluster configuration in accordance with the present invention.

FIG. 13 illustrates a configuration of multiple processors residing in different nodes 1300 accessing a storage cluster 1302 in parallel. In this context, a "processor" is typically given executable code, such as a module, program, process, thread or the like. The storage cluster may have one or more disk arrays 1304. A set of data I/O processors 1310 may or may not be sharing the same data stores among themselves for storing actual data. In this embodiment, a set of erasure coding processors 1320 work as a cluster to perform erasure encoding, decoding, recovery and reconstruction of the data stores. The erasure coding processors 1320 may or may not be sharing the same data stores among themselves for storing checksum data. For example, data I/O processor in node 1 may be writing only to disk 1, and data I/O processor in node 2 may be writing only to disk 2. Alternatively, all data I/O processors 1310 may be deemed a clustered application, in which case they share and parallel access the actual data stores. In that case, the erasure coding processors also may be clustered to perform parallel access to the checksum blocks.

Figure 14:
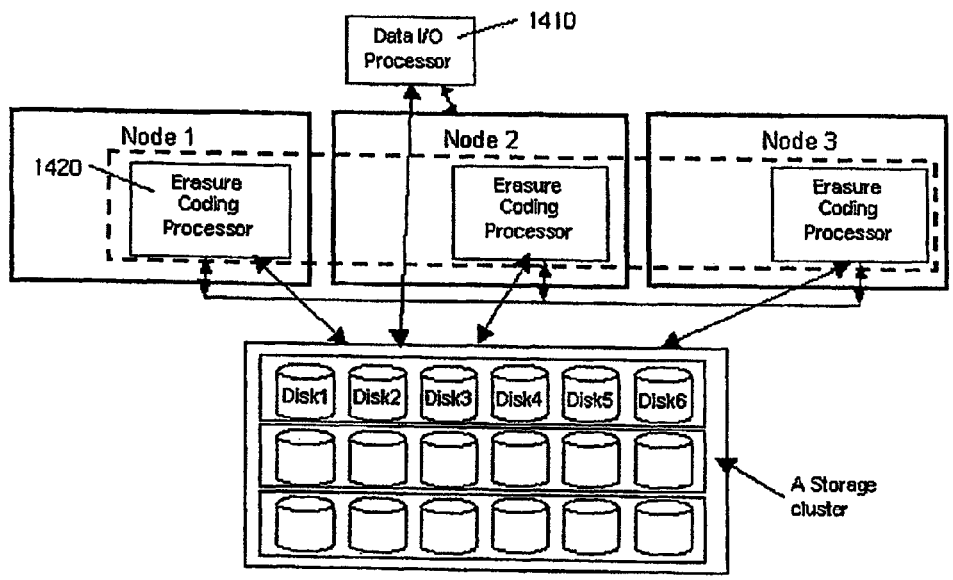
FIG. 14 provides another illustrative embodiment of an erasure coding processor cluster configuration in accordance with the invention.

FIG. 14 shows another configuration, where there is one data I/O processor 1410 and multiple erasure coding processors 1420. In this example, the erasure coding processors 1420 work as a cluster.

In either one of the configurations shown in FIG. 13 or 14, the storage cluster may be connected to the erasure coding processors or the data I/O processors through a network, which may be SCSI, Fiber channel loop, Fiber channel switch, or the like. As noted above, each processor may reside in a separate host, in a remote device over a wide area network, in a host in a local area network, in a given storage networking devices, or embedded inside a given storage device. The processor may be embedded in a semiconductor device in a storage controller card. One or both of the processor types may be embedded in some storage software components. For example, the processors may be part of a file system, a volume manager, a device driver, or even an application. The data I/O processor and erasure coding processor may also comprise one integrated processor.

D.2 Redundant Coding Service Cluster Operations

When an erasure coding cluster boots, when a new erasure coding processor is added to a running cluster, or when an erasure coding processor leaves the cluster, all the processors in the cluster preferably stop their runtime processing and enter into an initialization mode. During this mode, the erasure coding processors first negotiate for their responsibility, preferably using an initialization process. Then, the processors perform a consistency check (a recovery process) before they get into their regular functioning mode, so-called active mode.

During regular runtime, erasure coding processors in a cluster (such as shown in FIG. 13 or 14) preferably communicate with one another constantly to report their status and state of their health. The state and status information preferably includes a heartbeat and a status of their last operations. A data I/O processor also may report an operation status to one of the erasure coding processors; in such case, the erasure coding processor then propagates the operation status to all the other erasure coding processors in the cluster. When the erasure coding processors discover a failure (missing heartbeat or bad status) or a new processor (new heartbeat) joining the cluster, they return to the initialization mode. The communication among the erasure coding processors may be carried out through point-to-point connection channels or may be through broadcast or multicast. More generally, any convenient messaging technique or middleware may be used for such communications.

Figure 15:
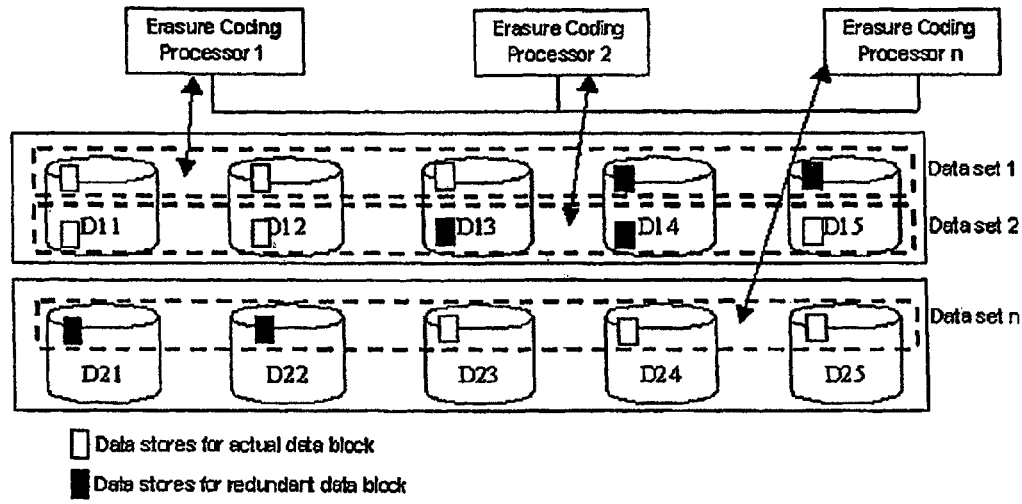
FIG. 15 illustrates one responsibility distribution in an erasure coding processor cluster in accordance with the invention.

To create a lock free clustered erasure coding solution according to the present invention, the erasure coding processors preferably negotiate with one another to decide the data sets for which each of them is responsible (for performing encoding and decoding). As long as a data set is managed by one and only one erasure coding processor, there is no need for locking. One such decision may be based on data set rotation, as illustrated in FIG. 15. In this example, if there are I number of erasure coding processors 1520, then processor 1 may be responsible for data set number 1, I+1, 2I+1 . . . , processor 2 may be responsible for data set number 2, I+2, 2I+2, . . . , and processor I may be responsible for data set number I, 2I, 3I, . . . Of course, this is merely representative, as there could be many different techniques for responsibility distribution.

Once the data set responsibility among an erasure coding cluster is decided, the processors perform a consistency check. As described above, the consistency check is a recovery process that considers the data sets that were involved in the most recent encoding operations, i.e., the operations prior to the cluster entering an initialization mode. The recovery process fixes inconsistent data sets. Once the consistency check is completed, the cluster enters into the active mode. During active mode, a data I/O processor may read or write data from the actual data stores. When a data I/O processor writes an actual data block to a data store, it determines which erasure coding processor is responsible for the data set and contacts that processor to perform the encoding. Alternatively, the data I/O processor may always contact a given erasure coding processor, which then communicates with a responsible erasure coding processor to perform the encoding. During a read operation, a data I/O processor reads the target data blocks from the corresponding data stores. If a data I/O processor is unable to retrieve the actual data during a read operation, it may contact an erasure coding processor or a responsible erasure coding processor to decode the actual data blocks it needs. In this embodiment, the block wrapper (as described in connection with FIG. 11) preferably is used for storing the sequence number of each block. The counter for generation of a next sequence number is simply a header of one of the checksum blocks in a data set that has the highest number.

D.3 Cluster Initialization Process and Recovery Process

As mentioned in the previous section, when a erasure coding cluster begins functioning (e.g., at boot), when a new erasure coding processor joins a cluster, or when an erasure coding processor leaves a cluster, the cluster of processors enter the initialization mode. For example, an erasure coding processor may leave a cluster due to functional failures (as reported by a data I/O processor), by missing heartbeats as a result of a crash, or by an operator removing the processor.

Figure 16:
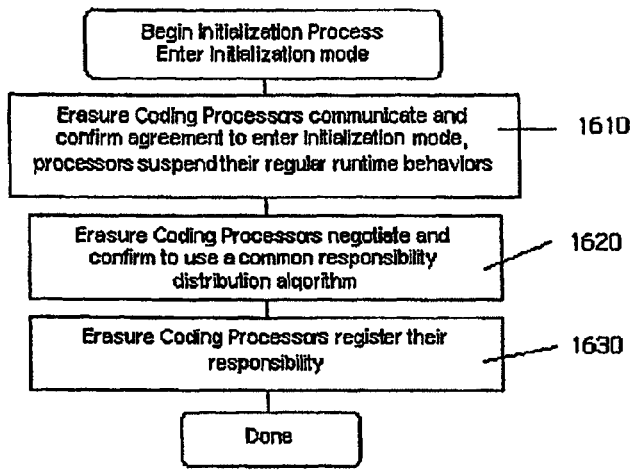
FIG. 16 is a process flow diagram showing a cluster initialization process in accordance with the invention.
Figure 17:
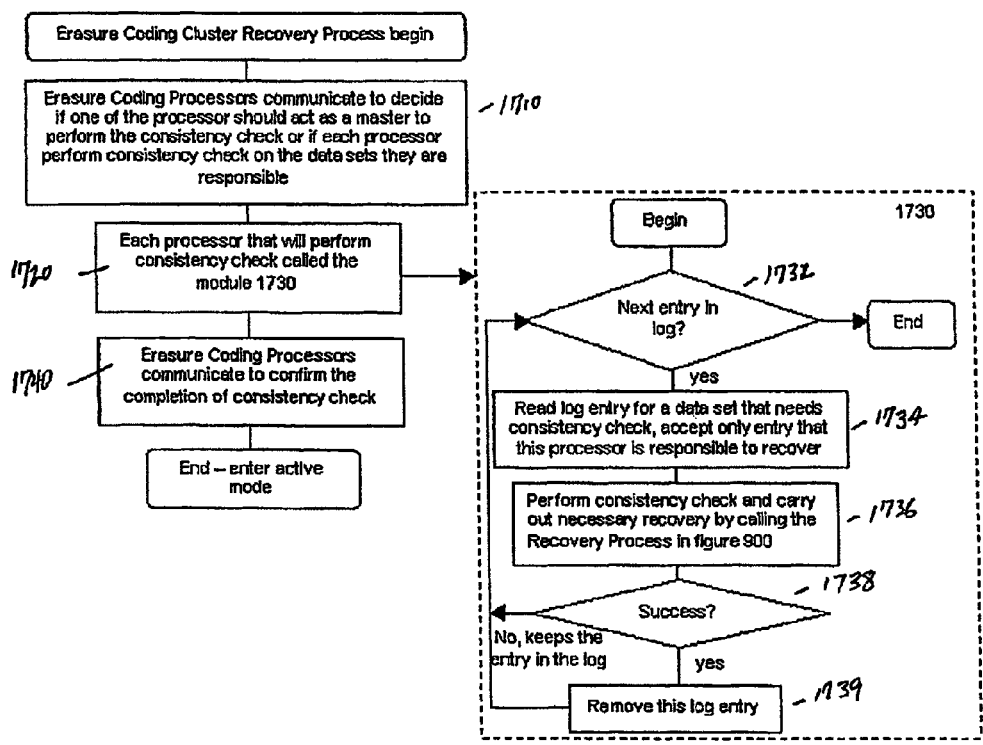
FIG. 17 is a process flow diagram showing a recovery process that may be implemented in the erasure coding cluster in accordance with the invention.

Preferably, a given erasure coding processor cluster performs several procedures during the initialization mode, namely an initialization process (as illustrated in FIG. 16), and a recovery process (as illustrated in FIG. 17). During the initialization process, the remaining erasure coding processors (including the newly joined processors, but preferably excluding any processors exiting the cluster) negotiate for their data set responsibility. In particular, the initialization process begins at step 1610 by having the processors confirm their agreement to enter into the initialization mode and to suspend their regular runtime behaviors. At step 1620, the erasure coding processors negotiate and confirm that they will use a given common responsibility distribution algorithm. An illustrative responsibility distribution algorithm is to assign to each erasure coding processor a number (1, 2, . . . , n), such that processor 1 is responsible for data sets (1, n+1, 2n+1, etc.), and so on. The responsibility algorithm is used to decide which processor is responsible for performing encoding and decoding, and any suitable algorithm may be used to implement the assignments. At step 1630, the processors register their responsibility to complete the processing. Thereafter, the processors carry out their recovery process (FIG. 17) to perform a consistency check and to recover bad data blocks. The recovery process is a desirable part of the initialization phase because it fixes inconsistent data sets before starting regular cluster activities. As noted above, data sets may become inconsistent when an erasure coding processor leaves a cluster, e.g., due to functional or system failure. In such case, the encoding process of a last data set prior to the initialization mode may not be completed and the data set might be in an inconsistent state. For an erasure coding processor to carry out a recovery process, each data I/O processor or erasure coding processor records a log when an encoding process is performed. The routine begins at step 1710. During this step, the erasure coding processors communicate with one another to elect a master to perform the recovery. At step 1720, each processor that will perform a consistency check then carries out the processing shown in module 1730. At step 1740, the erasure coding processors communicate to confirm completion of the consistency checks. The routine then continues at step 1740 with the cluster entering the active mode.

Module 1730 begins with a test at step 1732 to determine if there is a next entry in processor's log. If not, the routine ends. If the outcome of the test at step 1732 is positive, the routine continues at step 1734. At this step, the processor reads the log entry for a data set that needs a consistency check and accepts only the entries for which the processor is responsible. At step 1736, the processor performs the consistency check and carries out the necessary recovery, e.g., by calling the recovery process described in FIGS. 9A-9D. A test is then performed at step 1738 to determine whether the consistency check was successful. If not, the processor maintains the entry in its log. If the consistency check is successful, the routine continues at step 1739 to remove the entry from the log. The routine then cycles back to step 1732. Thus, during recovery, the last entry performed by each erasure coding processor is examined. As indicated by the process flow in module 1730, the recovery process may not be able to address all of the inconsistent data in the set because some data stores may not be available during the recovery process. In such case, the log entry for the data set is not removed; preferably, the consistency of that data set can be verified and addressed at a later time.

Once the recovery process of FIG. 17 is completed, the cluster enters a regular runtime mode. This was step 1740. During this mode, an encoding process (by an erasure coding processor) is coupled with every write operation by a Data I/O processor, and a decoding process (by an erasure coding processor) is coupled with every unsuccessful read operation by a data I/O processor. These operations are now described.

D.4 Write Operation and Lock-Free Clustered Erasure Encoding Process

Figure 18:
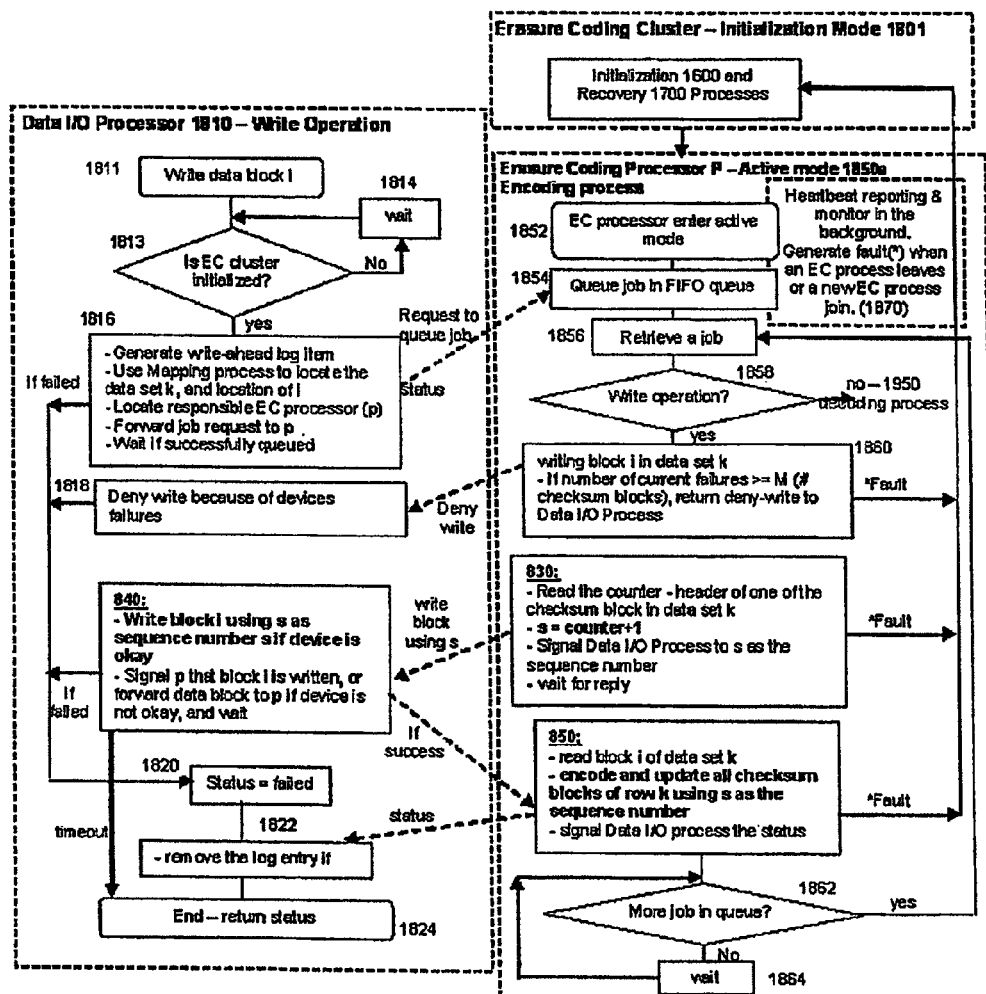
FIG. 18 is a process flow diagram showing a clustered erasure encoding process in accordance with the invention.

FIG. 18 shows a multithreaded data I/O processor write operation 1810 coupled with the erasure coding cluster encoding process 1850.

A data I/O processor responds to write requests and carries out a write operation for data block I beginning at step 1811. Step 1813 tests whether the erasure coding cluster is initialized; if so, the routine continues. If not, a wait state is entered at step 1814. Steps 1813-1814 provide that the data I/O processor blocks the write operation if the erasure coding cluster is not done with its initialization and recovery. Once the erasure coding cluster is initialized, the process continues at step 1816. At this step, the data I/O processor first enters a write-ahead log that can be used by the recovery process. Alternatively, the write-ahead log can be generated by the responsible erasure coding processor. Then, data I/O processor locates the data store of the data block and its associated data set. The data I/O processor calculates for the responsible erasure coding processor, preferably using the same algorithm used (during initialization) to distribute data set responsibility to the erasure coding processors. At step 1816, the data I/O processor also sends an encoding request to the responsible erasure coding processor and waits to see if the job request was successfully queued. If a failure occurs during step 1816 (e.g., if the data I/O processor fails to contact the erasure coding processor, or if the data I/O processor fails to forward the request), the data I/O processor rejects the request and returns a failed status as indicated at step 1820. The data I/O processor also rejects the write request if the responsible erasure coding processor denies the write request, which is step 1818.

Preferably, each erasure coding processor maintains a request queue and then performs the jobs (requests) one at a time (in a single or multi-threaded manner) and asynchronously. These operations are indicated by steps 1854, 1856, 1862 and 1864. In particular, at step 1852 the erasure coding processor is shown as entering the active mode. At step 1854, a job has been queued to the FIFO queue; the job is retrieved from the queue at step 1856. A test is then performed at step 1858 to determine if the job is a write. If no, the routine, branches to step 1950 in FIG. 19 to perform a decoding process. If, however, the outcome of the test at step 1858 is positive, the process continues at step 1860. At this time, the process may write the block in data set k.

Thus, when a job is retrieved, the erasure coding processor checks if it is an encoding request (a write operation) or a decoding request (a read operation). If the job is an encoding request, there must be enough available data stores in the data set to proceed. Thus, for erasure coding that supports N actual data blocks and M redundant blocks, there must be at least N number of available data stores available for the data set to recover from any failure. Thus, the erasure coding processor rejects the request if the number of available data stores is less than the number of actual data blocks. This is the deny-write operation shown originating at step 1860. This means that the number of failures is higher than the number of checksum blocks. The next several steps carry out the encoding in a manner that is similar to the process described in FIG. 8 except the steps are performed partly by the data I/O processor (step 840) and partly by the erasure coding processor (which preferably does steps 830 and 850). In particular, first the erasure coding processor gets a new sequence number (step 830). Then, the data I/O processor either writes the new data block to the data store or, if the data store is not available, the data I/O processor simply hands over the block to the erasure coding processor (step 840). The erasure coding processor then gets the new data and performs erasure encoding to update all the checksum blocks in the available data stores (step 850).

Preferably, the erasure coding process has a background processing thread to report its heartbeats to the other erasure coding processors in the cluster, as well as to monitor the heartbeats of the other processors. When an erasure coding processor detects either a new erasure coding processor or a missing erasure coding processor, the background thread may generate a fault. The fault then causes the erasure coding processor to finish its current job, to reject other jobs in the job queue, and to voluntarily enter the initialization mode as indicated by steps 1870, 1860, 830 and 850.

D.5 Read Operation and Lock-Free Clustered Decoding Process

Figure 19:
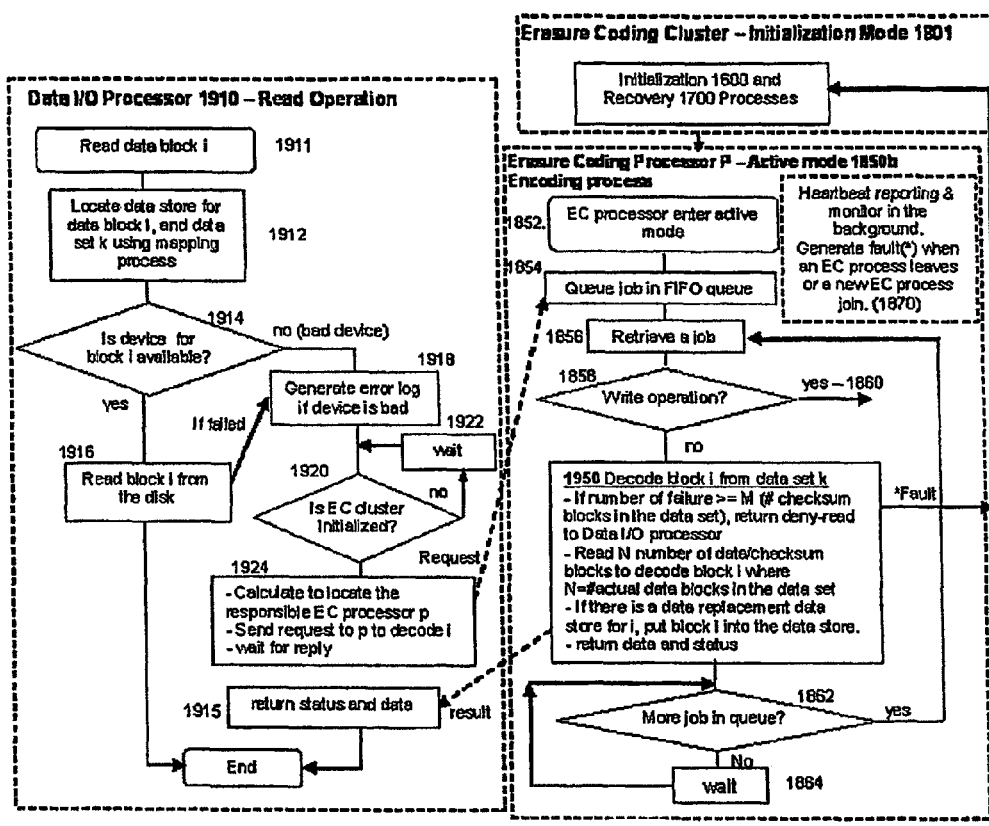
FIG. 19 is a process flow diagram showing a clustered erasure decoding process in accordance with the invention.

Referring now to FIG. 19, when a data I/O processor receives a read data block request, it simply locates the data store and reads the data block directly from the data store, as indicated by steps 1911, 1912 and 1916. If the device (e.g., a data store) is not available, the data I/O processor contacts an erasure coding processor to perform decoding to reconstruct the data block. The data I/O processor first ensures that the erasure coding cluster is not in the initialization mode, as indicated by steps 1920-1922. Preferably, the data I/O processor applies the same algorithm used during initialization to calculate and locate the responsible erasure coding processor for the data set. The data I/O processor then submits the decoding job and waits for a reply, as indicated by step 1924.

An erasure coding processor may use a job queue at step 1854 to manage job requests. The erasure coding processor is in the active mode at indicated at step 1852. A job is retrieved from the job queue at step 1856. A test is performed at step 1858 to determine if the job is a write. If so, the routine returns to step 1860 in FIG. 18. If the outcome of the test at step 1858 is negative, the job is a read and the process continues. When the erasure coding processor receives a decoding (read operation) request, the processor verifies that it has enough data or checksum blocks in the data set to decode the requesting block. If so, the erasure coding processor reads enough data or checksum blocks from the data stores and runs the decoding algorithm to reconstruct the requested data block. If there is a replacement data store for the data block, preferably the erasure coding process also places the reconstructed block into the replacement device, as indicated at step 1950. In its active mode, an erasure coding processor continues to process the job queue to perform encoding and decoding, as indicated by 1862-1864. Preferably, the erasure coding process includes a background processing thread to report its heartbeats to the other erasure coding processors in the cluster and to monitor the heartbeats of the other processors. This is indicated at step 1970. When an erasure coding processor either detects a new erasure coding processor or a missing erasure coding processor, the background thread may generate a fault. The fault then causes the erasure coding processor to finish its current job, to reject other jobs in the job queue, and to voluntarily enter the initialization mode, as indicated by steps 1970 and 1950.

D.6 Cluster Reconstruction Process

Figure 20:
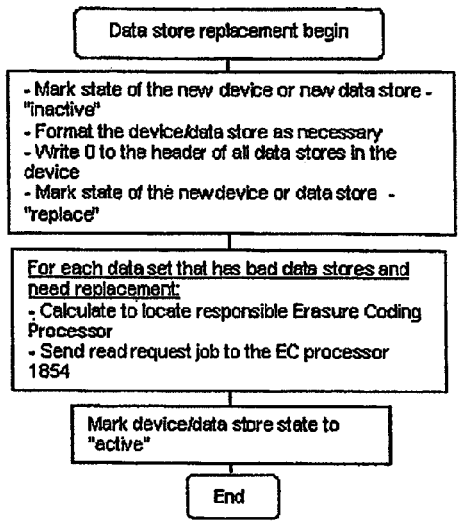
FIG. 20 is a process flow diagram showing a data store reconstruction process with clustered erasure coding processors in accordance with the invention.
Figure 21:
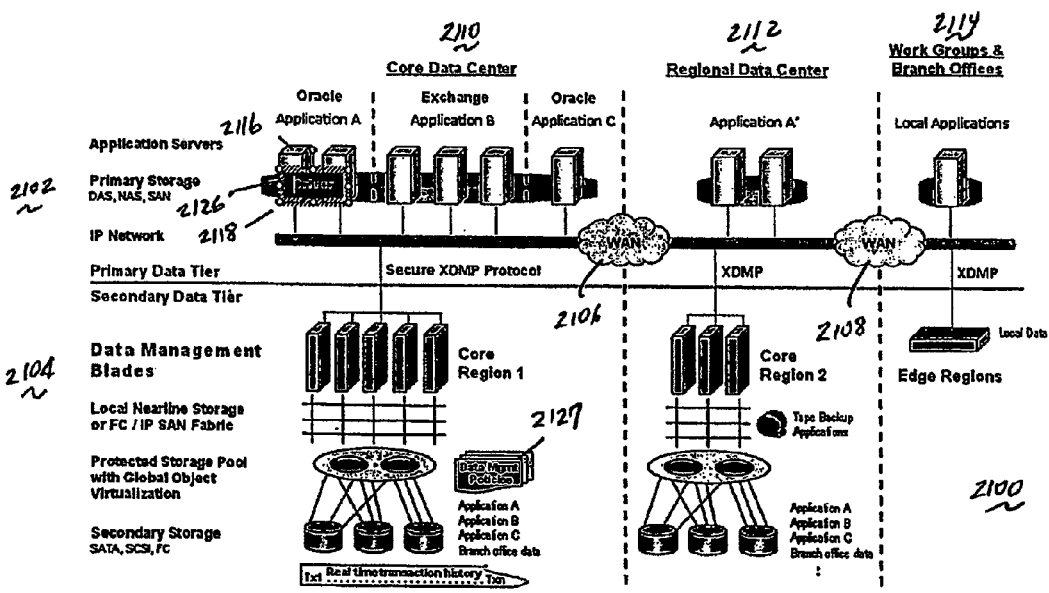
FIG. 21 is a block diagram of a representative enterprise in which the present invention may be implemented.

Referring now to FIG. 20, a reconstruction process is a process to recover lost data or checksum blocks due to damaged data stores. Thus, for example, when new replacement devices are inserted to a storage cluster to replace the bad devices, the reconstruction process examines the data sets that have missing data or checksum blocks that reside in the bad devices, recovers those blocks, and places them in the replacement devices together with proper labels.

Preferably, each data store device may be given one or three labels or states: "active," "inactive," or "replace." An "active" state is a normal functioning state of a device. An "inactive" state is the initial state of a raw and new device that has not been completely formatted or labeled. During recovery, a replacement device is in a "replace" state.

When a new device is inserted to replace some bad device, the new device is first initialized. During this operation, the device is formatted and labeled to facilitate its use as a data store for a data set. Before the initialization, preferably the device is set to an "inactive" state; after initialization, preferably the device state is set to "replace."

Once a device is prepared and ready for use as a replacement, the reconstruction process locates all the data sets that, due to data store failures, have missing data or checksum blocks. The reconstruction process uses a decoding process to recover the missing data or checksum blocks and to place the blocks into the replacement device. Once the reconstruction is completed, the device is ready to be used. This completes the processing.

Although not meant to be limiting, the present invention may be implemented in an enterprise such as illustrated in FIG. 2100. The enterprise comprises a primary data tier 2102 and a secondary data tier 2104 distributed over IP-based wide area networks 2106 and 2108. Wide area network 2106 interconnects two primary data centers 2110 and 2112, and wide area network 2108 interconnects a regional or satellite office 2114 to the rest of the enterprise. The primary data tier 2102 comprises application servers 2116 running various applications such as databases, email servers, file servers, and the like, together with associated primary storage 2118 (e.g., direct attached storage (DAS), network attached storage (NAS), storage area network (SAN)). The secondary storage may be serial ATA interconnection through SCSI, Fibre Channel (FC or the like), or iSCSI. The data management server nodes create a logical layer that offers object virtualization and protected data storage. The secondary data tier is interconnected to the primary data tier, preferably through one or more host drivers 2126 to provide real-time data services. Preferably, and as described below, the real-time data services are provided through a given I/O protocol for data transfer. Data management policies 2127 are implemented across the secondary storage in a well-known manner. A similar architecture is provided in data center 2112. In this example, the regional office 2114 does not have its own secondary storage, but relies instead on the facilities in the primary data centers.

The present invention provides a distributed clustering method to allow multiple active instances of consistency management processes that apply the same encoding scheme to be cooperative and function as one. The techniques described herein facilitate an efficient and simple method to apply an erasure encoding and decoding scheme across multiple dispersed data stores that receive constant updates. The technique can be applied on many forms of distributed persistent data stores to provide failure resiliency and to maintain data consistency and correctness.

While the present invention has been described in the context of a method or process, the present invention also relates to apparatus for performing the operations herein. As described above, this apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including optical disks, CD-ROMs, and magnetic-optical disks, read-only memories (ROMs), random access memories (RAMs), magnetic or optical cards, or any type of media suitable for storing electronic instructions, and each coupled to a computer system bus.

While the above written description also describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

What is claimed is:

1. An erasure encoding method comprising:
   providing a plurality of computer systems forming a distributed computer network, each computer system having a management process operating thereon;
   providing a plurality of distributed persistent memories, each persistent memory interoperably coupled to at least one of the computer systems and operative to receive constant updates;
   distributing via an erasure encoding process a plurality of data sets across the distributed persistent memories, each data set including at least one data block and at least one check sum block;
   initializing the management processes to operate as a cluster;
   wherein during the initializing of the management processes to operate as a cluster, each management process:
   agrees to enter into an initialization mode;
   enters into initialization mode;
   suspends regular run time processing; and
   registers its data-set management-process management responsibility;
   identifying the distributed persistent memories associated with each data set of the plurality of data sets;
   classifying whether the at least one data block and at least one checksum block of each data set are good;
   verifying if there are enough good blocks to recover each data set of the plurality of data sets;

performing a consistency check of the good blocks; and
recovering each data set of the plurality of data sets using the good blocks.

2. The method of claim 1 further comprising, for each management process, registering a data-set management-process management responsibility wherein the data-set management-process management responsibility is determined using a common responsibility distribution algorithm.

3. The method of claim 1 wherein each data set is associated with one management process having responsibility for performing encoding and decoding of the data set.

4. The method of claim 1 further comprising determining by a responsible management process, via a sequence indicator, whether each data block and each checksum block of each data set is modified completely.

5. The method of claim 4 wherein the sequence indicator is a sequence number entered into a header and a trailer of the at least one data block and the at least one checksum block of each data set.

\* \* \* \* \*